(12) United States Patent
Zhao et al.

(10) Patent No.: US 12,304,180 B2
(45) Date of Patent: May 20, 2025

(54) LOW SURFACE ROUGHNESS THERMAL INTERFACE DEVICE BASED ON GRAPHITE WITH BRANCHED SILOXANE HAVING HIGH THROUGH-PLANE THERMAL CONDUCTIVITY

(71) Applicant: Nano and Advanced Materials Institute Limited, Hong Kong (HK)

(72) Inventors: Jinliang Zhao, Hong Kong (HK); Yijun Liao, Hong Kong (HK); ChiHo Kwok, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 327 days.

(21) Appl. No.: 17/888,468

(22) Filed: Aug. 15, 2022

(65) Prior Publication Data
US 2023/0182453 A1 Jun. 15, 2023

Related U.S. Application Data

(63) Continuation-in-part of application No. 17/530,483, filed on Nov. 19, 2021.
(Continued)

(51) Int. Cl.
*B32B 27/08* (2006.01)
*B32B 7/03* (2019.01)
(Continued)

(52) U.S. Cl.
CPC ............ *B32B 27/08* (2013.01); *B32B 7/03* (2019.01); *B32B 27/20* (2013.01); *B32B 27/283* (2013.01);
(Continued)

(58) Field of Classification Search
CPC .............. B32B 27/08; B32B 7/03; B32B 27/20; B32B 27/283; B32B 37/10; B32B 37/203;
(Continued)

(56) References Cited

U.S. PATENT DOCUMENTS

| 6,672,378 B2 | 1/2004 | Rauch |
| 7,229,683 B2 | 6/2007 | Fischer et al. |

(Continued)

FOREIGN PATENT DOCUMENTS

| CN | 101768427 B | 6/2012 |
| CN | 103119091 A | 5/2013 |

(Continued)

OTHER PUBLICATIONS

He et al., "Thermally conductive and stretchable thermal interface materials prepared via vertical orientation of flake graphite", Composites Communications 27 (2021), 100795, pp. 1-6.
(Continued)

*Primary Examiner* — Alicia J Weydemeyer
*Assistant Examiner* — Laura B Figg
(74) *Attorney, Agent, or Firm* — IDEA Intellectual Limited; Margaret A. Burke; Sam T. Yip (57) ABSTRACT

An anisotropic thermal interface device including plural aligned thermally anisotropic conductive composite layers. Each layer has a first thermal conductivity in a first direction and a second, larger thermal conductivity in a second direction. The aligned thermally anisotropic conductive composite layers extend substantially parallel to each other in the first direction and include 45-95 weight percent graphite flakes aligned in the second direction. The thermally anisotropic conductive composite layers have a binder including a branched siloxane. The thermally anisotropic conductive composite layers are adhered to adjacent thermally anisotropic conductive composite. The thermally (Continued)

anisotropic conductive composite layers have a second thermal conductivity of 25 to 45 W/mK. The anisotropic thermal interface device has an arithmetic average surface roughness of 5 to 20 µm and a tensile strength of 50 to 130 KPa.

14 Claims, 10 Drawing Sheets

Related U.S. Application Data

(60) Provisional application No. 63/262,562, filed on Oct. 15, 2021, provisional application No. 63/118,021, filed on Nov. 25, 2020.

(51) Int. Cl.
| | |
|---|---|
| *B32B 27/20* | (2006.01) |
| *B32B 27/28* | (2006.01) |
| *B32B 37/10* | (2006.01) |
| *B32B 37/20* | (2006.01) |
| *B32B 38/00* | (2006.01) |

(52) U.S. Cl.
CPC ............ *B32B 37/10* (2013.01); *B32B 37/203* (2013.01); *B32B 38/0004* (2013.01); *B32B 2038/0064* (2013.01); *B32B 2264/108* (2013.01); *B32B 2305/30* (2013.01); *B32B 2307/302* (2013.01); *B32B 2307/536* (2013.01); *B32B 2307/538* (2013.01); *B32B 2307/54* (2013.01); *B32B 2313/04* (2013.01); *B32B 2383/00* (2013.01)

(58) Field of Classification Search
CPC ........ B32B 38/0004; B32B 2038/0064; B32B 2264/108; B32B 2305/30; B32B 2307/302; B32B 2307/536; B32B 2307/538; B32B 2307/54; B32B 2313/04; B32B 2383/00
See application file for complete search history.

(56) References Cited

U.S. PATENT DOCUMENTS

| | | | |
|---|---|---|---|
| 8,268,282 B2 | 9/2012 | Hougham et al. | |
| 8,431,048 B2 | 4/2013 | Kuczynski et al. | |
| 8,632,879 B2 | 1/2014 | Weisenberger | |
| 9,111,899 B2 | 8/2015 | Bartley et al. | |
| 9,308,695 B2 | 4/2016 | Usui et al. | |
| 2004/0000415 A1 | 1/2004 | Rizzo et al. | |
| 2006/0251897 A1 | 11/2006 | Pan et al. | |
| 2007/0231560 A1* | 10/2007 | Zhang | F28F 13/00 |
| | | | 428/323 |
| 2010/0172101 A1 | 7/2010 | Yao et al. | |
| 2012/0234524 A1 | 9/2012 | Fan et al. | |
| 2013/0136895 A1* | 5/2013 | Usui | B29C 48/91 |
| | | | 428/141 |
| 2014/0357770 A1* | 12/2014 | Depierro | C08L 21/00 |
| | | | 524/451 |
| 2015/0118514 A1 | 4/2015 | Zhao et al. | |
| 2016/0326419 A1 | 11/2016 | Balandin | |
| 2018/0244890 A1* | 8/2018 | Hikmet | C08J 3/02 |
| 2019/0162491 A1 | 5/2019 | Sun et al. | |
| 2019/0323785 A1 | 10/2019 | Eid et al. | |

FOREIGN PATENT DOCUMENTS

| | | |
|---|---|---|
| CN | 103396642 A | 11/2013 |
| CN | 103748681 A | 4/2014 |
| CN | 103025653 B | 11/2015 |
| CN | 105542728 A | 5/2016 |
| CN | 111944224 A | 11/2020 |

OTHER PUBLICATIONS

Pandit et al., "Precontrolled Alignment of Graphite Nanoplatelets in Polymeric Composites Prevents Bacterial Attachment", Wiley-VCH Verlag GmbH&Co. KGaA, Weinheim, Small (2020), 1904756, pp. 1-11.

Xue et al., "Improvement in thermal conductivity of through-plane aligned boron nitride/silicone rubber composites", Materials and Design 165 (2019), 107580, pp. 1-8.

Akash Mohanty et al., "Dielectric breakdown performance of alumina/epoxy resin nanocomposites under high voltage application", Materials and Design 47 (2013), pp. 711-716.

Mehdi Salehirad et al., "Synthesis and characterization of functionalized Fe3O4/boron nitride as magnetically alignable 2D-nanofiller to improve the thermal conductivity of epoxy nanocomposites", Industrial & Engineering Chemistry Research, 2018, pp. 1-43.

"3M™ Boron Nitride Cooling Fillers", www.3M.com/thermalmanagement, 2018, pp. 1-8.

Office Action of the corresponding China patent application No. 202111408040.6 mailed on Jul. 9, 2024.

* cited by examiner

LOW SURFACE ROUGHNESS THERMAL INTERFACE DEVICE BASED ON GRAPHITE WITH BRANCHED SILOXANE HAVING HIGH THROUGH-PLANE THERMAL CONDUCTIVITY

CROSS-REFERENCE TO RELATED APPLICATIONS

The present invention claims priority to provisional patent application 63/262,562 filed 22 Oct. 2021, and non-provisional patent application Ser. No. 17/530,483, filed Nov. 19, 2021, which claims priority to provisional patent application 63/118,021 Nov. 24, 2020, the disclosures of which are incorporated by reference herein.

FIELD OF THE INVENTION

The present invention relates to thermal interface devices in general and, more particularly, to thermal interface devices made from branched siloxane and vertically aligned macro graphite flakes, having low surface roughness, high strength and high thermal conductivity.

BACKGROUND

The increasing proliferation of portable electronics, with concomitant miniaturization of heat-producing electronic components, places further heat transfer demands on thermal interface materials. In particular, the unprecedented high processing rates required by 5G technology create an unusual set of demands on effective heat dissipation for 5G devices.

Thermal interface materials (TIMs) are effective heat transfer materials to fill the gap between an electronic component heat source and a heat sink in order to dissipate the heat rapidly. An excellent TIM should have high through-plane thermal conductivity and low thermal impedance. To increase the thermal conductivity of TIMs, graphite has been considered as a competitive candidate due to its high bulky thermal conductivity (up to 470 W/mK), and relatively low cost. TIM products with high thermal conductivity are typically characterized using the ASTM E1461 standard, which ignores issues of contact resistance between the thermal interface materials and the electronic component. The through-plane thermal conductivity of most commercially-available graphite-based thermal pad products is still within a low range (<20 W/mK via ASTM 5470-06 standard). This low thermal conductivity may be attributed to two reasons: 1) low concentration of graphite fillers and 2) high contact resistance due to either a hard TIM texture or high TIM surface roughness. However, when graphite and other thermally conductive fillers are added in larger proportions, the curing process of a silicone binder is severely affected, leading to very poor mechanical strength. Further, high proportions of graphite and other thermally conductive fillers generate TIMs with extremely high hardness and high surface roughness, which negatively impact the TIM.

Thus, there is a need in the art for improved graphite-based thermal interface materials having ultrahigh thermal conductivity while maintaining sufficient softness and low surface roughness. The present invention addresses this need.

SUMMARY OF THE INVENTION

In one aspect, the present invention provides an anisotropic thermal interface device. The device includes plural aligned thermally anisotropic conductive composite layers. each layer has a first thermal conductivity in a first direction and a second, larger thermal conductivity in a second direction. The aligned thermally anisotropic conductive composite layers extend substantially parallel to each other in the first direction.

Each of the thermally anisotropic conductive composite layers includes 45-95 weight percent graphite flakes; the graphite flakes are aligned in the second direction approximately perpendicular to the first direction such that x-y planes of the flakes align in the second direction having the second, larger thermal conductivity. The thermally anisotropic conductive composite layers have a binder including a branched siloxane.

The thermally anisotropic conductive composite layers are adhered to adjacent thermally anisotropic conductive composite layers to create a laminated anisotropic composite thermal interface device. The thermally anisotropic conductive composite layers have a second thermal conductivity of 25 to 45 W/mK. The anisotropic thermal interface device has an arithmetic average surface roughness of 5 to 20 μm and a tensile strength of 50 to 130 KPa.

In another aspect, the thermally anisotropic conductive composite layers have 0.05 to 0.2 weight percent of branched siloxanes.

In another aspect, the thermally anisotropic conductive composite layers include 50 weight percent or less of thermally conductive filler.

In another aspect, the thermally conductive filler is one or more of boron nitride, silicon nitride, aluminum nitride, titanium nitride, aluminum oxide, beryllia, zirconia, silicon carbide, boron carbide, magnesium hydroxide, magnesium oxide, or aluminum hydroxide.

In another aspect, the thermally conductive filler incudes particles having a sphere, rod or irregular shape.

In another aspect, the particles have first and second size distributions with the first size distribution having a median particle size between 2 and 5 microns, and the second size distribution having a median particle size of between 0.5 μm and 0.8 microns.

In another aspect, the ratio of particles having the first size distribution to the ratio of particles having the second size distribution is approximately 2:1 to 8:1.

In another aspect, each of the thermally anisotropic conductive composite layers has a thickness of 0.1 to 0.6 mm.

In another aspect, the device has a Shore C hardness of 30 to 70.

In another aspect the present invention provides method of making the anisotropic thermal interface device described above. The method includes hot pressing or roll pressing a mixture of 45-95 weight percent graphite flakes with a binder including a branched siloxane to create an aligned thermally anisotropic conductive composite layer having a first thermal conductivity in a first direction and a second, larger thermal conductivity in a second direction. A plurality of the composite layers is laminated to one another to create a stacked composite layer. The stacked composite layers are sliced in a direction perpendicular to a direction of stacking to create the anisotropic thermal interface device with plural anisotropic conductive composite layers extending substantially parallel to each other in the first direction followed by polishing a top and a bottom surface.

In another aspect, the slicing is performed using an ultrasonic cutter.

In another aspect, the hot pressing or roll pressing is performed at 90-150° C.

In another aspect, the stacked composite layer is further heated and pressed following stacking.

In another aspect, the polishing is performed using sandpaper, polishing cloth, or polishing wheel.

DETAILED DESCRIPTION

Figure 2:
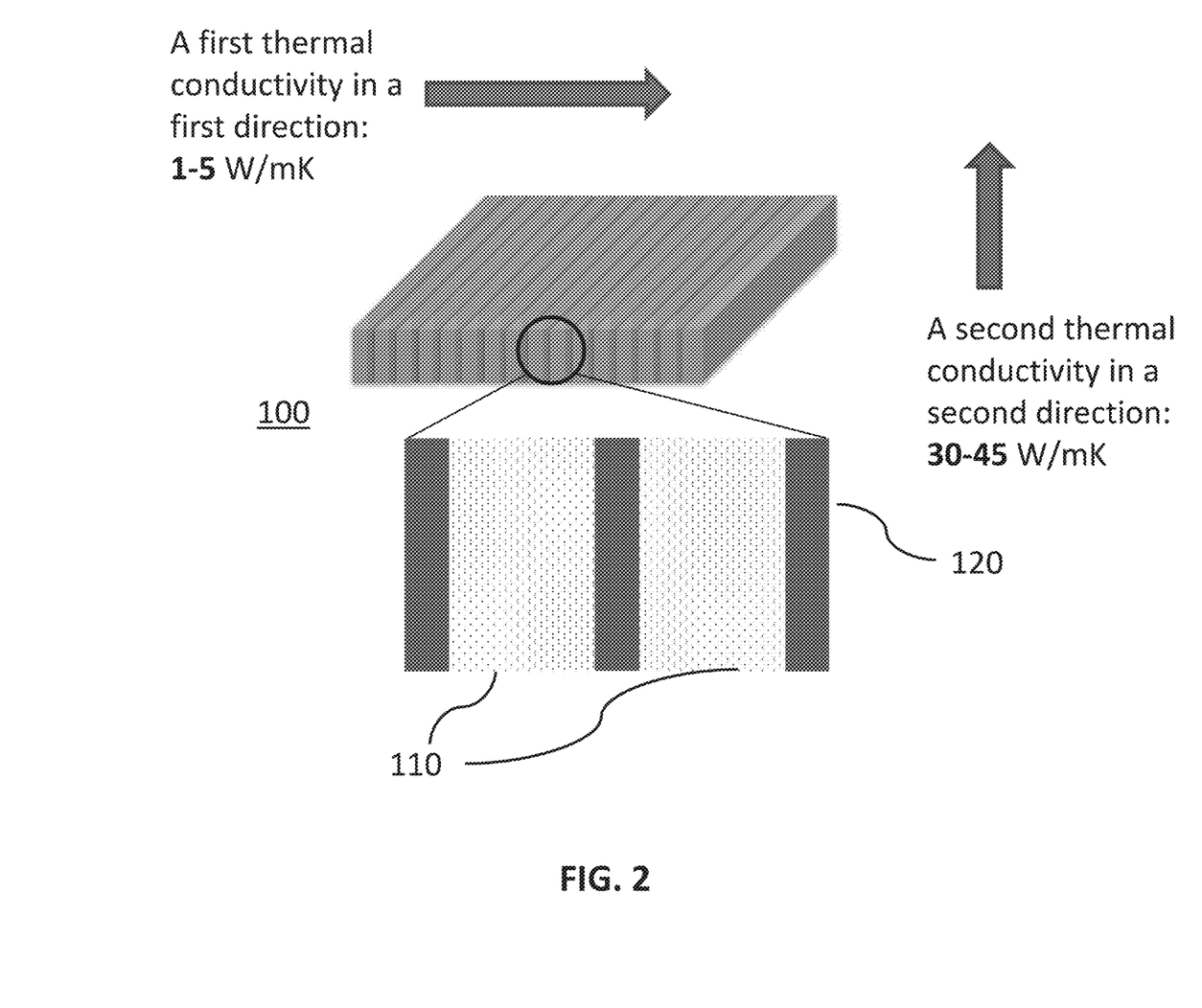
FIG. 2 depicts a thermal interface device according to an embodiment.

Turning to FIG. 2, a thermal interface device 100 is depicted. Thermal interface device 100 includes plural composite layers 110 and, in some embodiments, optional adhesive layers 120. Each composite layer 110 includes approximately 45 to 95 weight percent macro graphite flakes, optional additional thermally conductive fillers, and a matrix that includes at least one branched siloxane in an amount of 0.05 to 0.2 weight percent with the balance being a linear siloxane. The matrix may be a total weight percent of approximately 5 to approximately 25 weight percent based on the totally weight of the thermal interface device. The adhesive layers 120 include linear siloxane. The tensile strength of device 100 is 50 to 130 KPa while the Shore C hardness is 30 to 70. The through-plane thermal conductivity of composite layers 110 is 25 to 45 W/mK measured via the ASTM 5470-06 standard. Each of the thermally anisotropic conductive composite layers has a thickness of 0.1 to 0.6 mm while the overall thickness of device 100 may range from approximately 0.5 mm to approximately 3 mm. Thicker or thinner devices may be custom made for specific applications.

Figure 1:
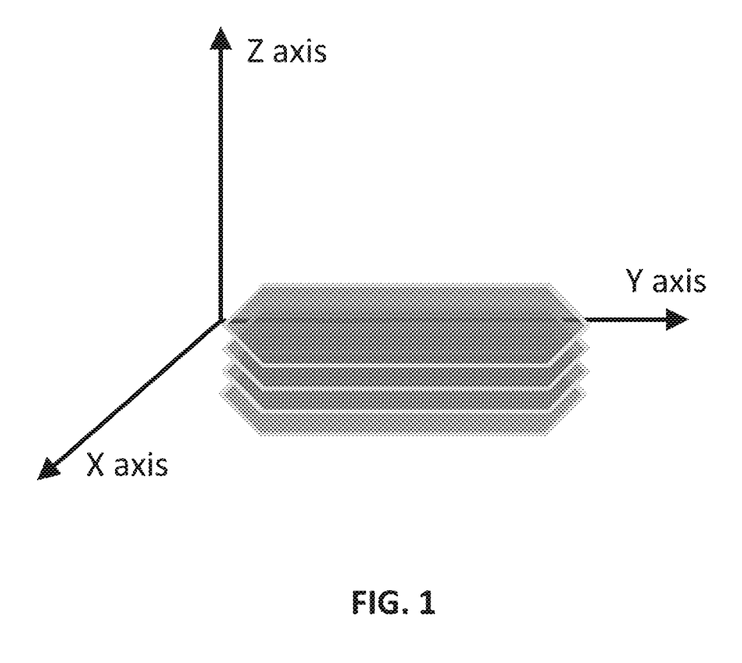
FIG. 1 is a schematic depiction of a graphite flake, depicted the x-y plane and the z direction perpendicular to the x-y plane.

Graphite is known to have high in-plane thermal conductivity; this in-plane conductivity corresponds to the x-y plane of in FIG. 1. The thermal conductivity in the z-plane of FIG. 1 is substantially less than the x-y plane, which may have a thermal conductivity up to approximately 470 W/mK. To assist in aligning the graphite flakes, it is preferable to use macro graphite flakes, that is, graphite flakes with a size on the order of approximately 0.5 to 1.0 mm. It has been determined that graphite flakes of this size can generate good alignment and allow high filler concentration, consequently resulting in high anisotropic thermal conductivity.

As seen in FIG. 2, the plural aligned thermally anisotropic conductive composite layers 110 are aligned such that they have a first thermal conductivity in a first direction (for example the horizontal direction in FIG. 2) and a second, larger thermal conductivity in the second direction (that is, the vertical direction in FIG. 2). That is, in the example of FIG. 2, the x-y planes of the graphite flakes shown in FIG. 1 are aligned parallel to the vertical axis, as seen in the enlarged portion in which each small parallel line schematically depicts an aligned graphite flake. Each thermally conductive composite layer 110 is aligned substantially parallel to each other in the first direction (in this example, extending along the horizontal direction).

The additional thermal fillers may be approximately 50 weight percent or less of particles of boron nitride, silicon nitride, aluminum nitride, titanium nitride, aluminum oxide, beryllia, zirconia, silicon carbide, boron carbide, magnesium hydroxide, magnesium oxide, aluminum hydroxide, and combinations of these particles. The particles may have a variety of particle shapes include spheres, rods, or irregular shapes.

The branched siloxane in composite layers 110 include functional groups of epoxy, ether, hydrogen, hydroxyl or vinyl groups. Unlike conventional linear silicone-based thermal pads, which transform into a clay-like structure and lose elasticity at high filler concentrations, the branched siloxanes in the thermal interface materials of the present invention maintain an elastic rubber structure even at the high filler percentages used. Even at a mass fraction of thermal fillers within 70.0% to 95.0 wt %, the Shore C hardness is less than 50. The arithmetic surface roughness may be from 5 to 20 μm; in one aspect, it may be less than 7 μm. Together with the softness of the material the contact resistance issue is mitigated. That is, the thermal interface materials of the present invention have a sufficiently low surface roughness and sufficiently high softness that the materials make intimate physical and, consequently, thermal contact with the underlying electronic device to ensure thermal transfer from the electronic device.

Generally speaking, with higher graphite flakes concentration (and, optionally, other filler concentration), the thermal interface material 100 shows correspondingly higher thermal conductivity. Conventionally, thermal interface materials that use linear silicone as their matrix use it for its low viscosity and softness after curing. Low viscosity facilitates addition of fillers and results in easier mixing. However, when graphite and other thermal fillers are added in large proportions, the curing process of the silicone is severely affected, leading to very poor mechanical strength. Similarly, high proportions of graphite and other thermal fillers generate TIMs with extremely high hardness and high surface roughness, both of which are undesirable properties for thermal interface materials as hard and rough surfaces will not make intimate contact with electronic devices/device packages.

Figure 6:
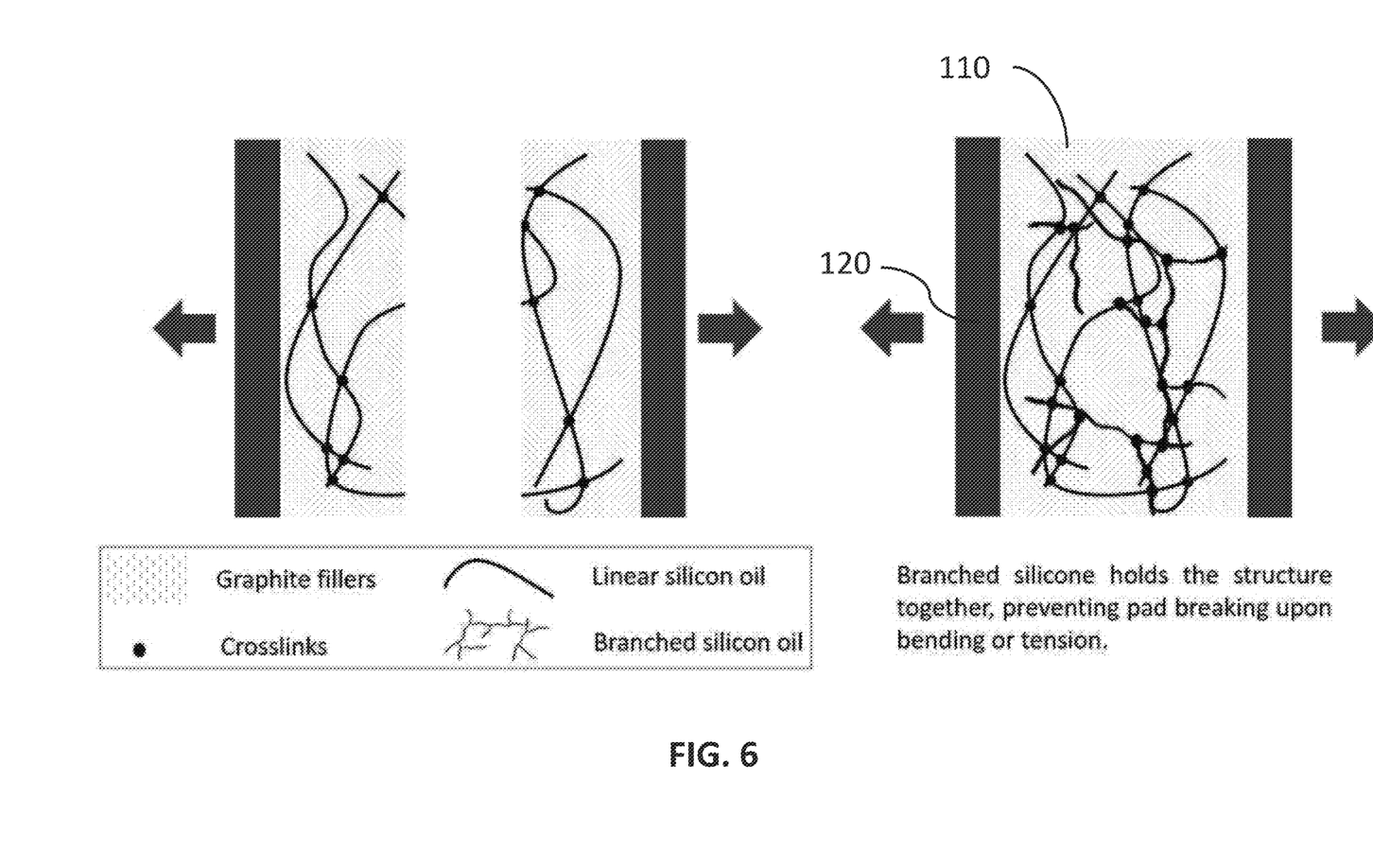
FIG. 6 depicts branched siloxane reinforcing the thermal interface material structure.

As depicted in FIG. 6, a portion of linear siloxane of the siloxane matrix (typically 0.05 to 0.2 weight percent) is replaced by branched siloxane to increase the crosslinks of the thermal interface material matrix. This structural enforcement helps to maintain the elasticity and mechanical strength and, importantly, allows graphite and other thermal fillers to be added at a higher limit, thus increasing the overall thermal conductivity of device 100. In particular, the branched siloxane holds the thermal interface device together, preventing breakage upon being subjected to bending or tension.

Figure 3:
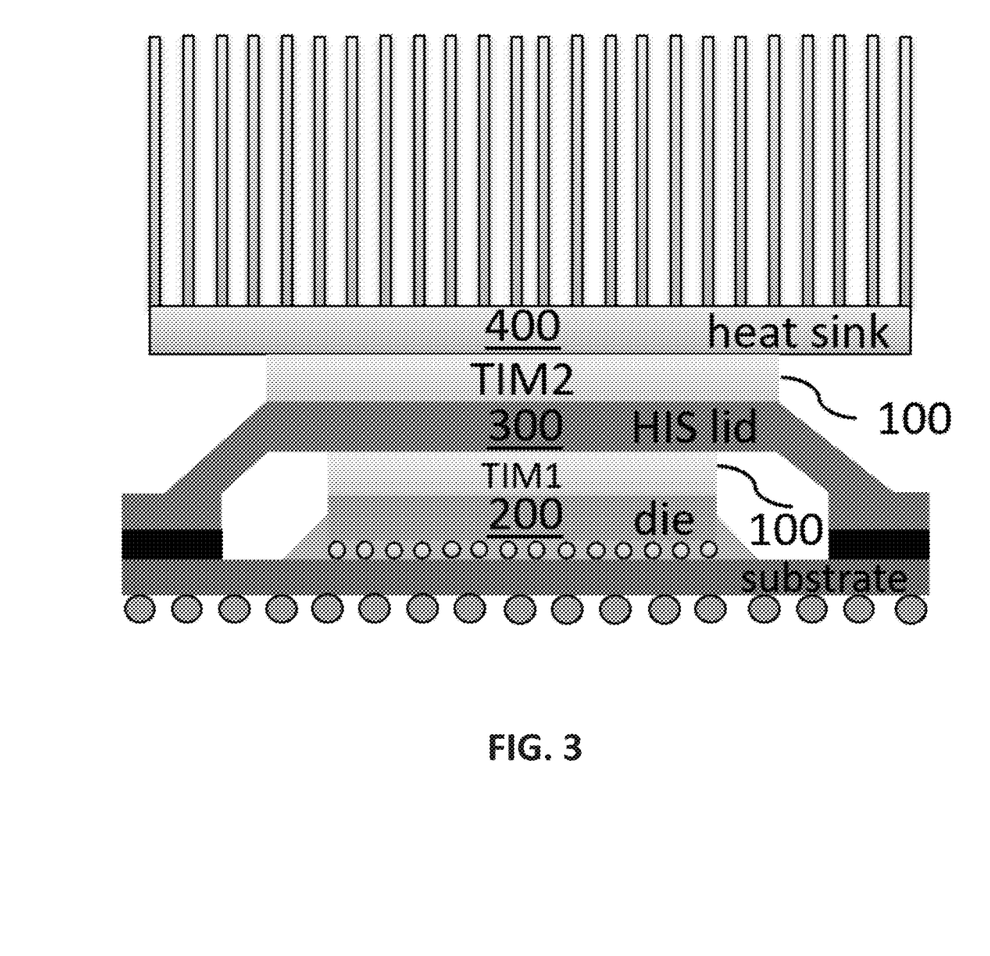
FIG. 3 depicts the use of thermal interface materials with an electronic device.

In use, the thermal interface device may be positioned adjacent to a heat-generating electronic component 200, as depicted in FIG. 3. In FIG. 3, a first thermal interface device 100 is positioned between the die 200 and the IHS (integrated heat spreader) lid 300. A further thermal interface device 100 is positioned between the IHS lid 300 and the heat sink 400.

Figure 4A:
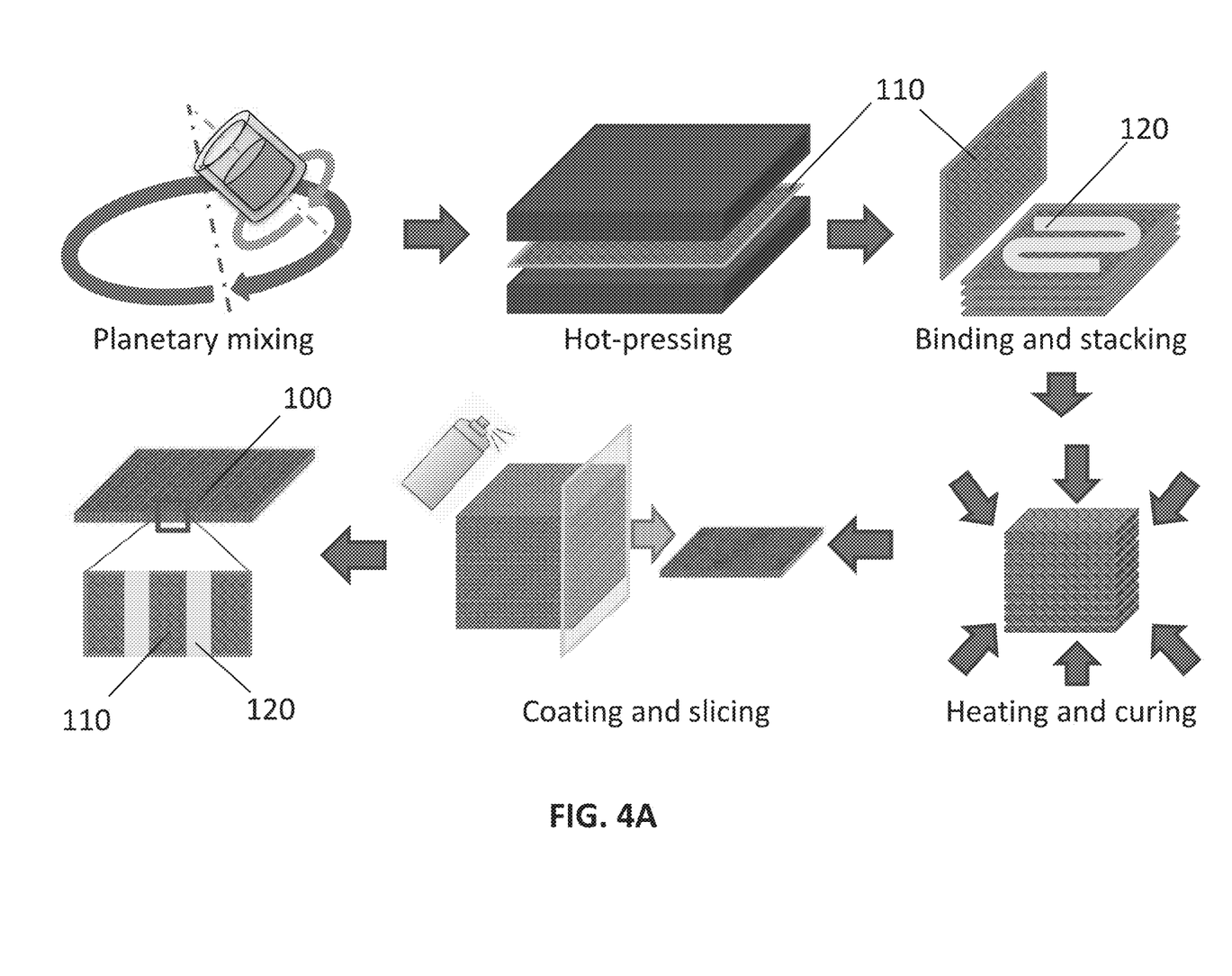
FIG. 4A schematically depicts a hot pressing method for fabricating the thermal interface device of FIG. 2.

FIG. 4A depicts a manufacturing process for the thermal interface device 100 involving hot pressing. A mixture of macro graphite flakes, optionally other thermal fillers, curable branched siloxane, curable linear siloxane and a catalyst is formed by planetary mixing. The mixture is then subjected to hot-pressing at 90-150° C. at a pressure of 500-5000 psi for several minutes to form the graphite composite layers 110. Sequentially, multiple graphite composite layers 110 are vertically stacked and laminated with adhesive layer 120 positioned between adjacent composite layers 110 to form a composite laminate. An optional silicone spray is used to coat the stack. After the adhesive layers 120 are cured, the laminated and stacked graphite composite layers 110 are sliced (e.g., using an ultrasonic slicer) in the vertical direction to obtain the thermal interface device 100; device 100 has plural anisotropic conductive composite layers extending substantially parallel to each other in the first direction and having the direction of higher conductivity in the second direction, which is approximately perpendicular to the first direction as seen in FIG. 2. To further decrease the surface roughness, a top and bottom contact surface of the thermal interface device is polished. The polishing may be performed using sandpaper, polishing cloth, or polishing wheel.

Figure 4B:
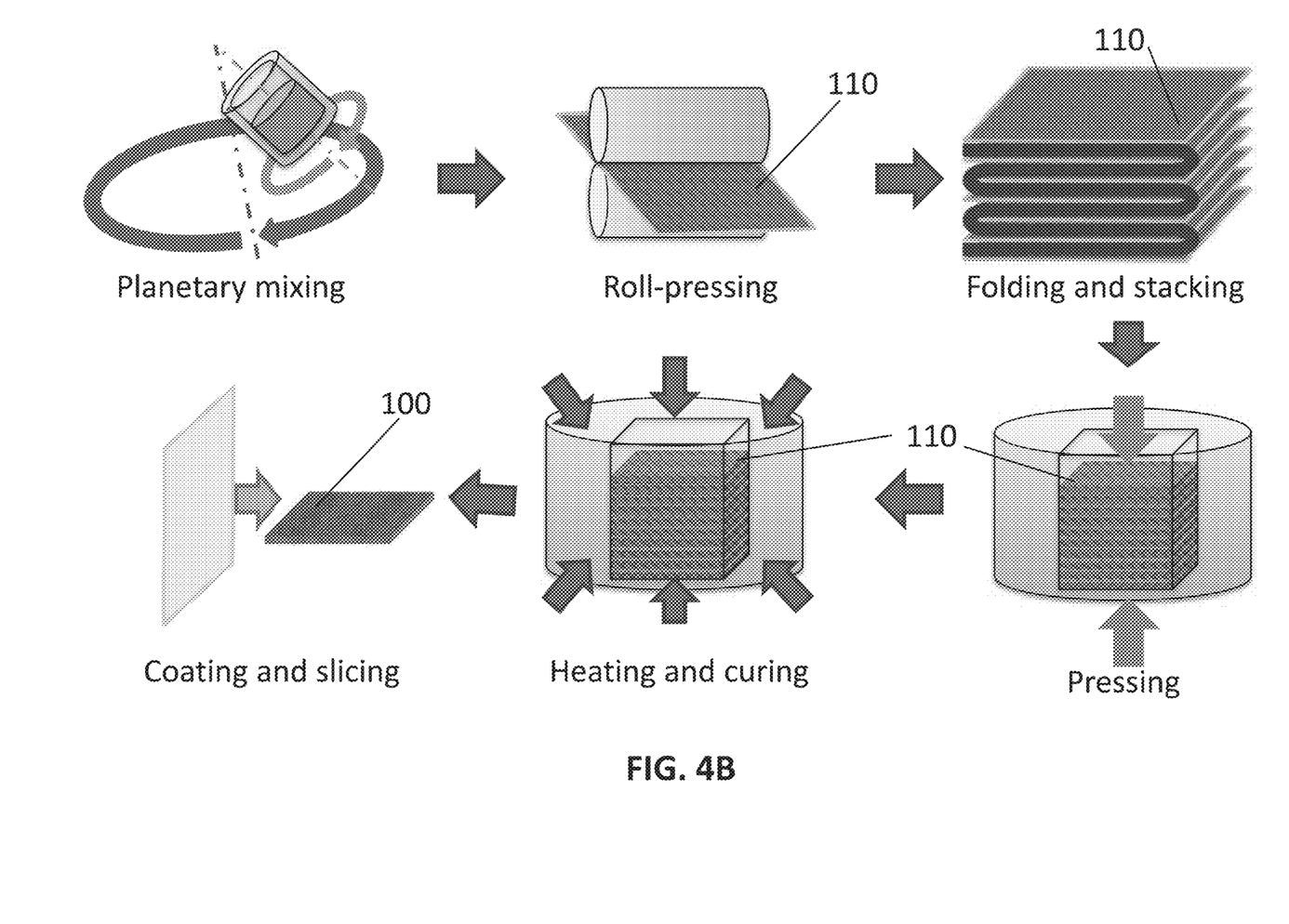
FIG. 4B schematically depicts a roll pressing method for fabricating the thermal interface of FIG. 2.
Figure 5:
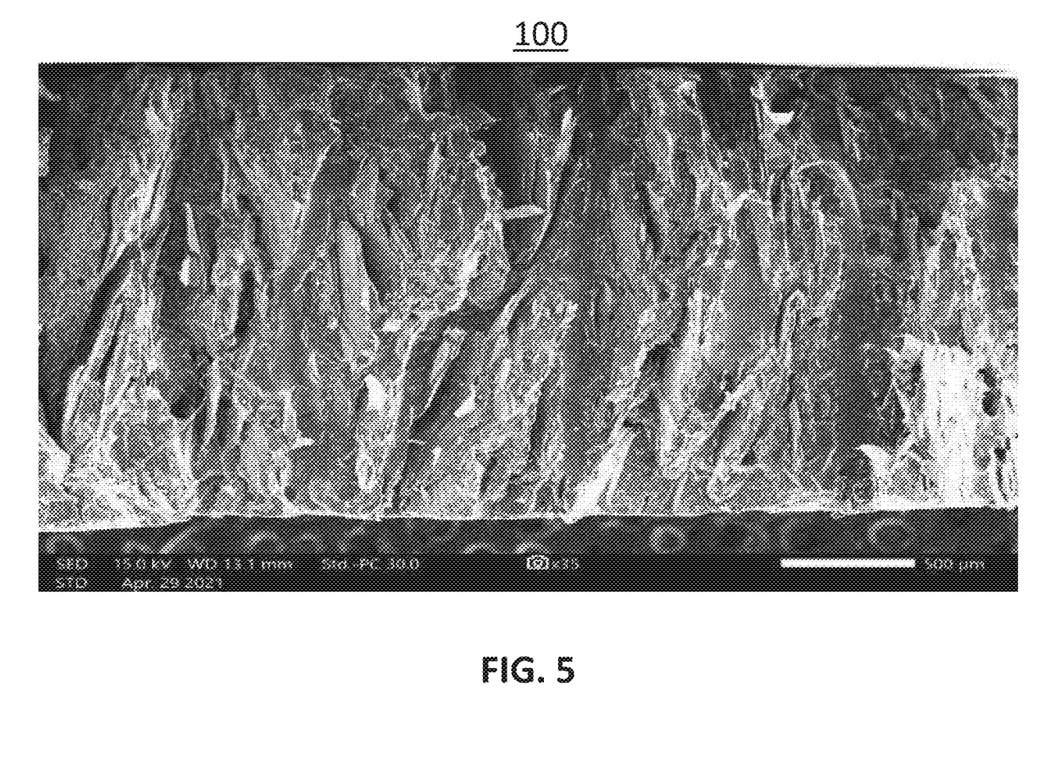
FIG. 5 is a photomicrograph of cross-section of thermal interface device of FIG. 2 depicting the vertical alignment of graphite flakes.

FIG. 4B depicts a further manufacturing process for the thermal interface device 100 involving roll pressing. A mixture of graphite flakes, optionally other thermal fillers, curable branched siloxane, curable linear siloxane and a catalyst is formed by planetary mixing. The mixture is then subjected to roll pressing, following by folding and stacking. The stacked layer is pressed followed by heating and curing and coating and slicing. Polishing may be performed as described above.

The thermal interface devices of the present invention were tested for thermal conductivity. Table 1 indicates through-plane thermal conductivity result via ASTM 5470-06 standard. The samples without branched silicone normally possess a clay-like structure at high graphite concentration and cannot be tested according to this standard.

TABLE 1

Through-plane thermal conductivity result via ASTM 5470-06 standard

| Sample | Thermal Conductivity (W/mK) | Imp °C. cm²/W | Thickness (mm) |
| --- | --- | --- | --- |
| 1 | 31.92 | 0.80 | 1.54 |
| 2 | 36.44 | 1.05 | 3.05 |
| 3 | 39.37 | 1.24 | 4.51 |
| Reported Tc | 44.77 | | |

Figure 7:
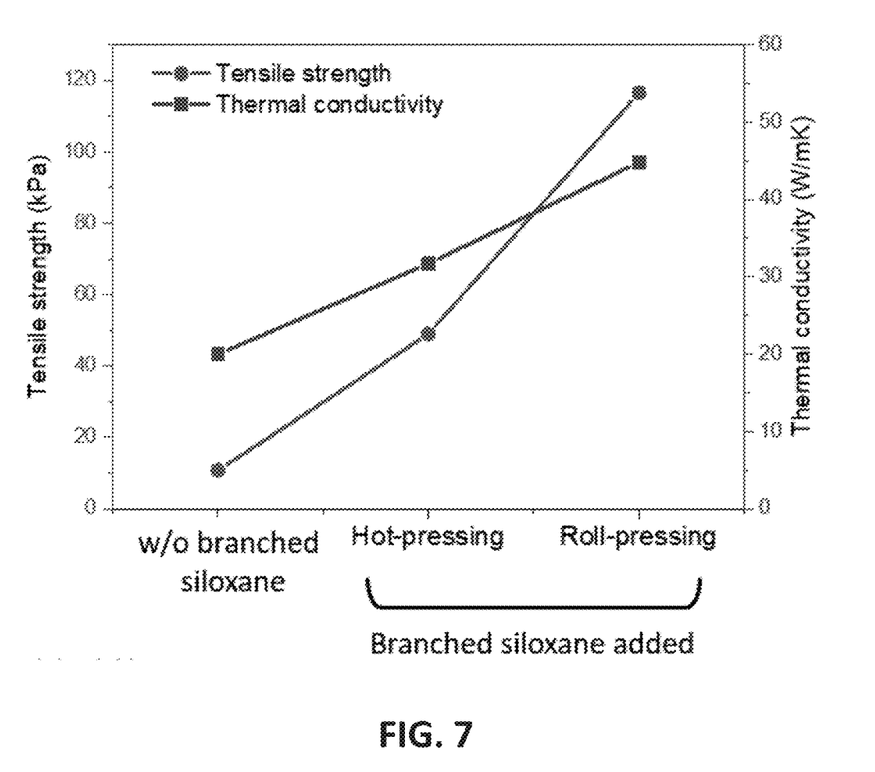
FIG. 7 depicts the tensile strength and thermal conductivity of thermal interface devices of the present invention compared to thermal interface devices without branched siloxane.

The mechanical strength is characterized by tensile test in the direction perpendicular to the graphite composite film plane. FIG. 7 depicts the increase in thermal conductivity and tensile strength of TIMs with branched siloxane added for both hot pressing and roll pressing. The results indicate that with branched siloxane replacement of linear silicone, the thermal conductivity and mechanical strength both improve significantly.

Figure 8:
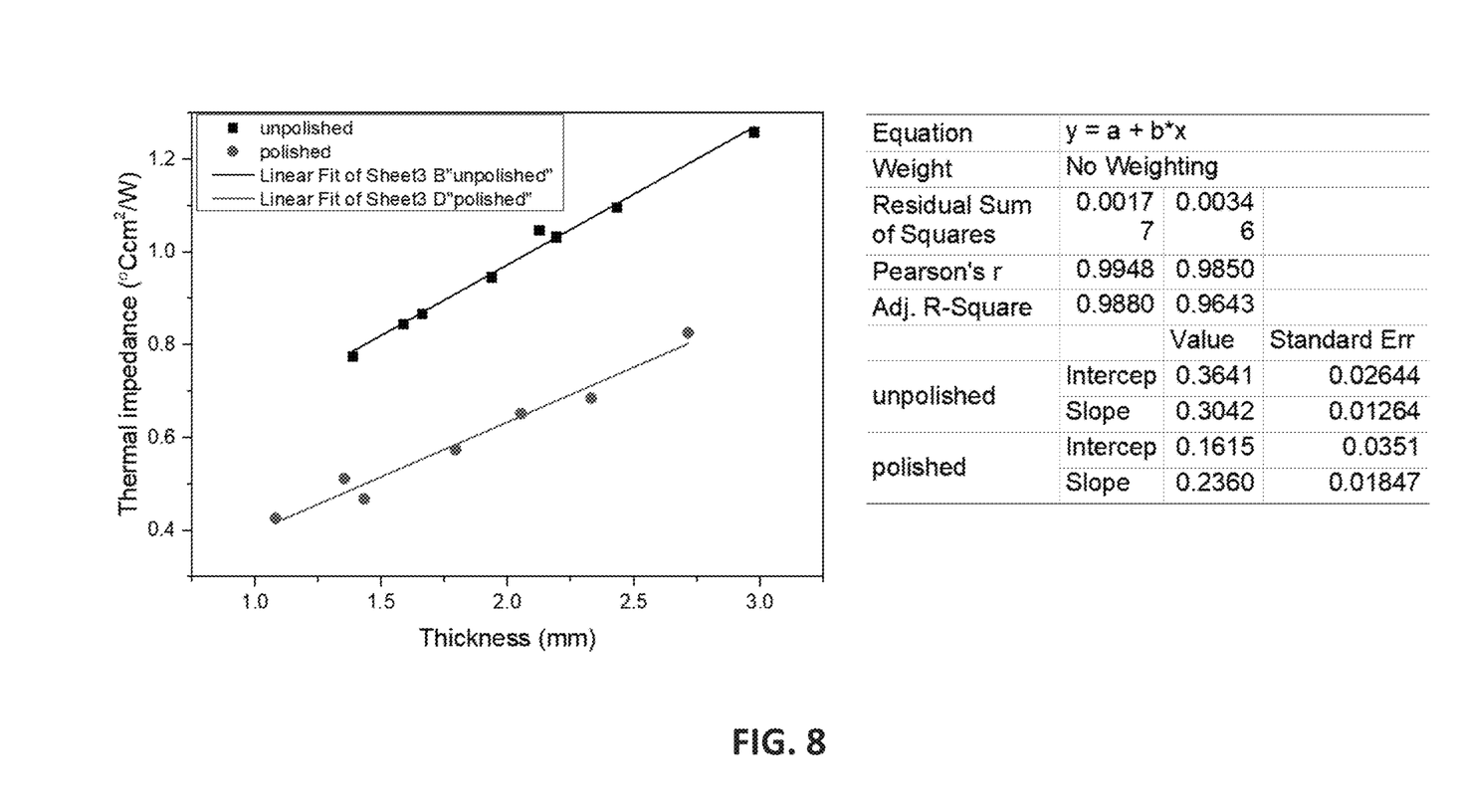
FIG. 8 shows the improved thermal impedance of polished thermal interface devices.

In another aspect, the thermal interface devices of the present invention may be polished in order to further reduce surface roughness. FIG. 8 depicts the thermal impedance of thermal interface devices vs. thickness, demonstrating a reduced thermal impedance for polished devices. The thermal conductivity is calculated vis ASTM 5470-06 by the equation below:

Thermal conductivity calculation equation via ASTM 5470-06:

$$\frac{10}{k} = \frac{\Delta Imp}{\Delta h}$$

k: thermal conductivity; Imp: thermal impedance; h: thickness;

k unpolished=32.87 W/mK k polished=42.37 W/mK

Figure 9A:
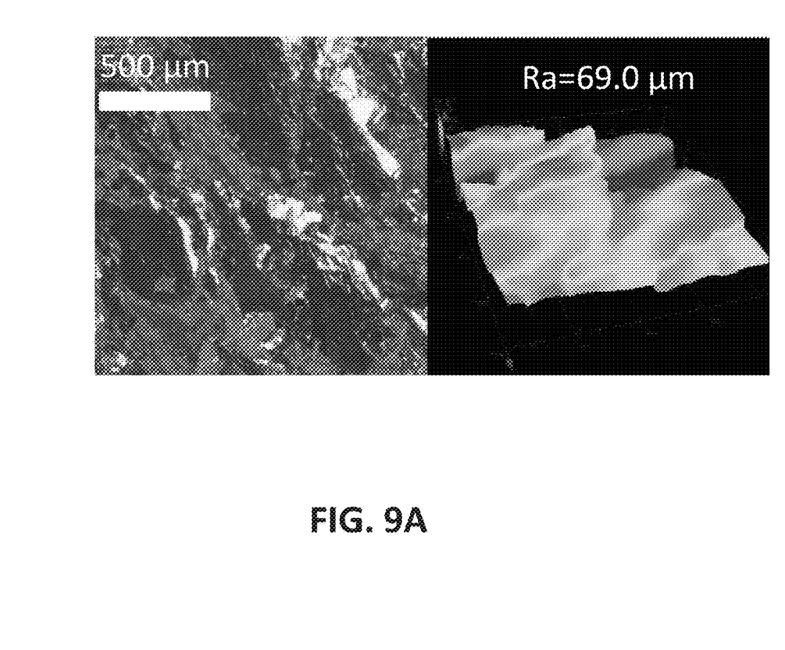
FIGS. 9A and 9B show the reduced surface roughness for polished samples.
Figure 9B:
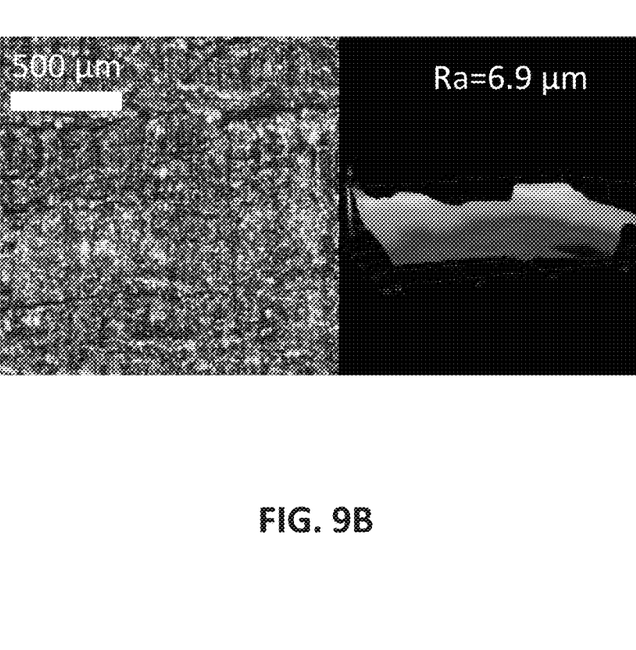

The arithmetic surface roughness ranges from be from 5 to 20 μm; in one aspect, it may be less than 7 μm for polished samples. FIG. 9A depicts the surface of an unpolished sample vs. the surface of a polished sample depicted in 9B. The corresponding surface roughness profiles are also depicted.

Advantages:

The pressing-stacking-slicing techniques used in the present invention can align graphite fillers at a low cost and scalable condition, resulting in a through-plane thermal conductivity of 45 W/mK. The use of branched siloxane enhances the mechanical stability of the pad. In addition, the thermal conductivity of the pad increases with the loading force which is suitable for some systems with designed mounting requirement. This thermal pad design can solve technical issues of heat dissipation of chips with high calculation rates, 5G communication devices, and consumer electronics.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suitable for the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The invention claimed is:

1. A low surface roughness anisotropic thermal interface device comprising:
   plural aligned thermally anisotropic conductive composite layers having a first thermal conductivity in a first direction and a second, larger thermal conductivity in a second direction, the aligned thermally conductive composite layers extending substantially parallel to each other in the first direction;
   each of the thermally anisotropic conductive composite layers including 70-95 weight percent thermal filler, wherein the thermal filler includes macro graphite flakes in an amount from 45-95 weight percent, the graphite flakes having a size of approximately 0.5 mm to 1.0 mm, the graphite flakes being aligned in the second direction approximately perpendicular to the first direction such that x-y planes of the flakes align in the second direction having the second, larger thermal conductivity, the thermally anisotropic conductive composite layers having a binder including a linear siloxane and a branched siloxane, the binder having a total weight percent of approximately 5 to approximately 25 weight percent;
   the thermally anisotropic conductive composite layers being adhered to adjacent thermally anisotropic conductive composite layers to create a laminated anisotropic composite thermal interface device;
   the anisotropic thermal interface device having an arithmetic average surface roughness of approximately 5 to 20 μm and a tensile strength of approximately 50 to 130 KPa and a thermal conductivity of 25 to 45 W/mK.

2. The anisotropic thermal interface device of claim 1, wherein the thermally anisotropic conductive composite layers have 0.05 to 0.2 weight percent of the branched siloxane.

3. The anisotropic thermal interface device of claim 1, wherein the thermally anisotropic conductive composite layers further include 50 weight percent or less of thermally conductive filler.

4. The anisotropic thermal interface device of claim 3, wherein the thermally conductive filler is one or more of boron nitride, silicon nitride, aluminum nitride, titanium nitride, aluminum oxide, beryllia, zirconia, silicon carbide, boron carbide, magnesium hydroxide, magnesium oxide, or aluminum hydroxide.

5. The anisotropic thermal interface device of claim 3, wherein the thermally conductive filler incudes particles having a sphere, rod or irregular shape.

6. The anisotropic thermal interface device of claim 5, wherein the thermally conductive filler particles have first and second size distributions with the first size distribution having a median particle size between 2 and 5 microns, and the second size distribution having a median particle size of between 0.5 μm and 1.5 microns.

7. The anisotropic thermal interface device of claim 6, wherein the ratio of particles having the first size distribution to the ratio of particles having the second size distribution is approximately 2:1 to 8:1.

8. The anisotropic thermal interface device of claim 1, wherein each of the thermally anisotropic conductive composite layers has a thickness of 0.1 to 0.6 mm.

9. The anisotropic thermal interface device of claim 1, wherein the device has a Shore C hardness of 30 to 70.

10. A method of making the anisotropic thermal interface device of claim 1, comprising:
    hot pressing or roll pressing a mixture of 70-95 weight percent thermal filler including 45-95 weight percent macro graphite flakes having a size of approximately 0.5 mm to 1.0 mm with a binder including a linear siloxane and a branched siloxane the binder having a total weight percent of approximately 5 to approximately 25 weight percent to create an aligned thermally anisotropic conductive composite layer having a first thermal conductivity in a first direction and a second, larger thermal conductivity in a second direction;
    laminating a plurality of the composite layers to one another to create a stacked composite layer;
    slicing the stacked composite laminated layer in a direction perpendicular to a direction of stacking to create the anisotropic thermal interface device with plural anisotropic conductive composite layers extending substantially parallel to each other in the first direction; and
    polishing the sliced thermal interface device to obtain low roughness on both a top and a bottom surface.

11. The method of claim 10, wherein the slicing is performed using an ultrasonic cutter.

12. The method of claim 10, wherein the method is hot pressing and the hot pressing is performed at 90-150° C.

13. The method of claim 10 wherein the method is roll pressing and the stacked composite layer is further heated and pressed following stacking.

14. The method of claim 10, wherein the polishing is performed using sandpaper, polishing cloth, or polishing wheel.

\* \* \* \* \*